(12) United States Patent
Sakata

(10) Patent No.: US 10,679,878 B2
(45) Date of Patent: Jun. 9, 2020

(54) SUBSTRATE PROCESSING APPARATUS

(71) Applicant: TOKYO ELECTRON LIMITED, Tokyo (JP)

(72) Inventor: Kazunari Sakata, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/936,797

(22) Filed: Mar. 27, 2018

(65) Prior Publication Data

US 2018/0286716 A1    Oct. 4, 2018

(30) Foreign Application Priority Data

Mar. 31, 2017    (JP) ................................ 2017-070175

(51) Int. Cl.
| H01L 21/67 | (2006.01) |
| H01L 21/677 | (2006.01) |
| H01L 21/687 | (2006.01) |

(52) U.S. Cl.
CPC .. *H01L 21/67201* (2013.01); *H01L 21/67745* (2013.01); *H01L 21/68707* (2013.01)

(58) Field of Classification Search
None
See application file for complete search history.

(56) References Cited

U.S. PATENT DOCUMENTS

| 3,968,885 | A | * | 7/1976 | Hassan | ................ | B23Q 7/1431 |
| | | | | | | 414/591 |
| 5,695,564 | A | * | 12/1997 | Imahashi | .............. | C23C 14/568 |
| | | | | | | 118/719 |
| 6,059,507 | A | * | 5/2000 | Adams | .................. | G03F 7/7075 |
| | | | | | | 414/217 |
| 7,218,382 | B2 | * | 5/2007 | Kasumi | ............ | H01L 21/67201 |
| | | | | | | 355/72 |
| 8,313,277 | B2 | * | 11/2012 | van der Meulen | .... | B65G 25/02 |
| | | | | | | 414/217 |
| 9,016,998 | B2 | * | 4/2015 | Blahnik | ............ | H01L 21/67201 |
| | | | | | | 414/217 |
| 9,669,552 | B2 | * | 6/2017 | Vopat | .................... | B25J 15/0052 |
| 2006/0182532 | A1 | * | 8/2006 | Okada | ............... | H01L 21/67201 |
| | | | | | | 414/217 |
| 2015/0311102 | A1 | * | 10/2015 | Weiss | ................ | H01L 21/67126 |
| | | | | | | 414/222.01 |

FOREIGN PATENT DOCUMENTS

| JP | S5039070 A | 4/1975 |
| JP | 201468009 A | 4/2014 |

* cited by examiner

*Primary Examiner* — Mark C Hageman
(74) *Attorney, Agent, or Firm* — Nath, Goldberg & Meyer; Jerald L. Meyer

(57) ABSTRACT

A substrate processing apparatus includes a substrate processing part configured to process a substrate under a vacuum atmosphere, a substrate transfer part connected to the substrate processing part and configured to transfer the substrate under an air atmosphere, and a load lock part disposed between the substrate processing part and the substrate transfer part and configured to switch between the air atmosphere and the vacuum atmosphere. At least a part of the load lock part is disposed inside the substrate transfer part.

5 Claims, 24 Drawing Sheets

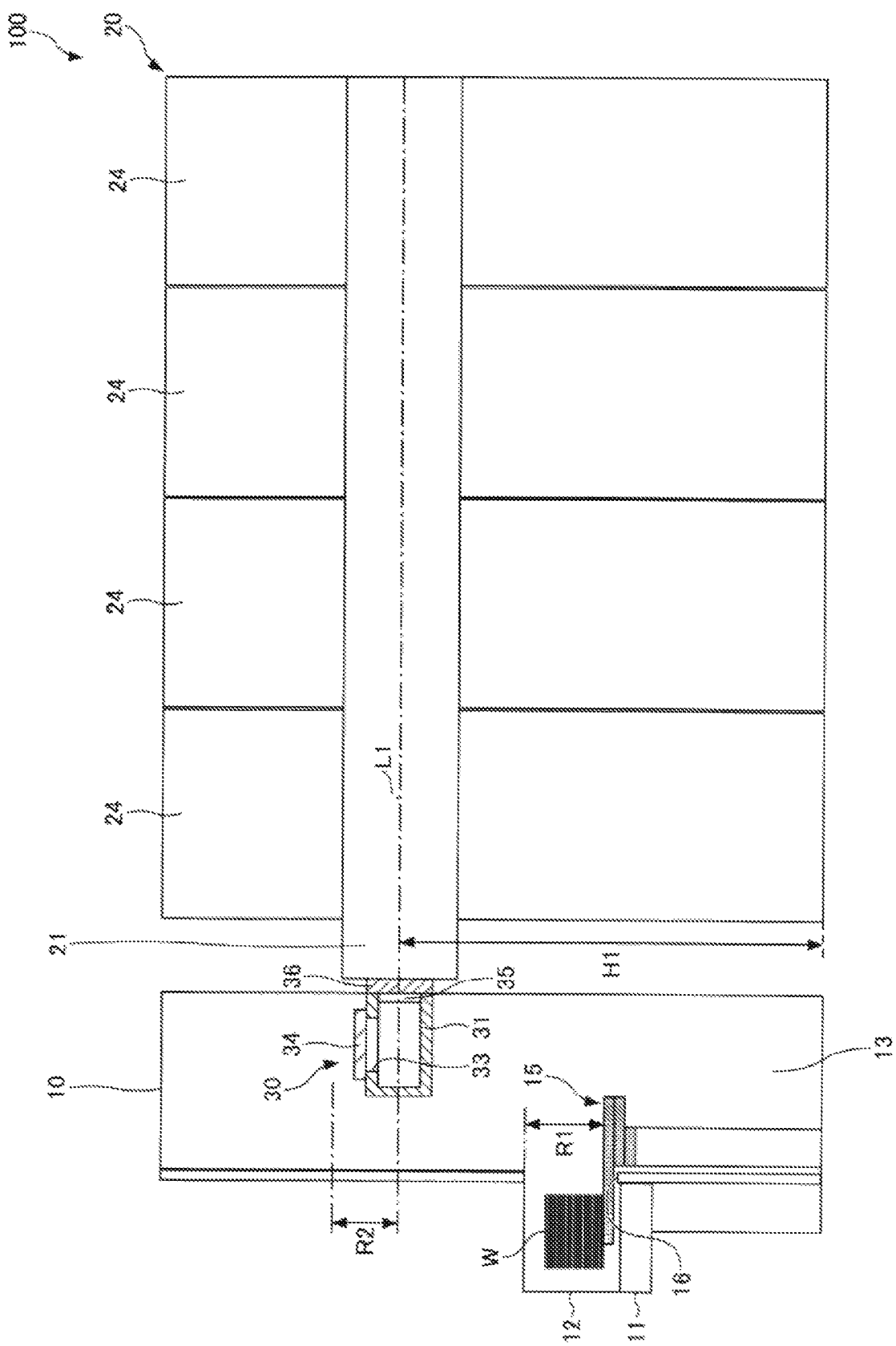

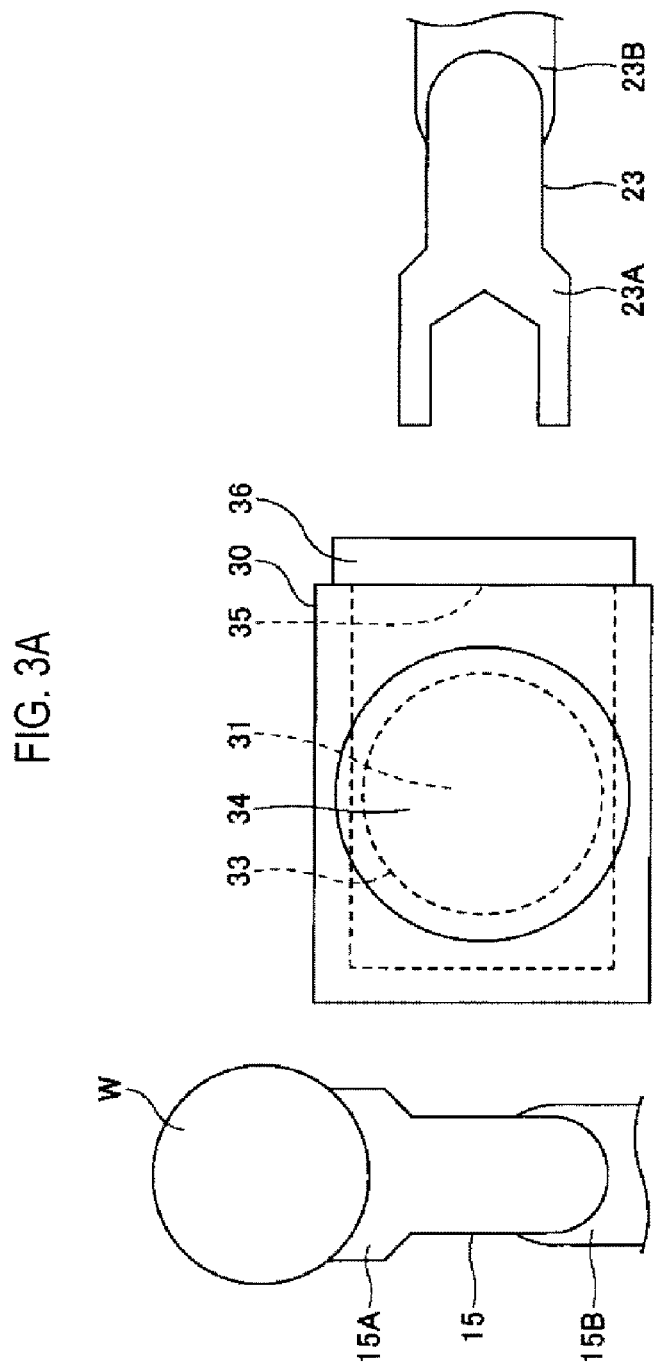

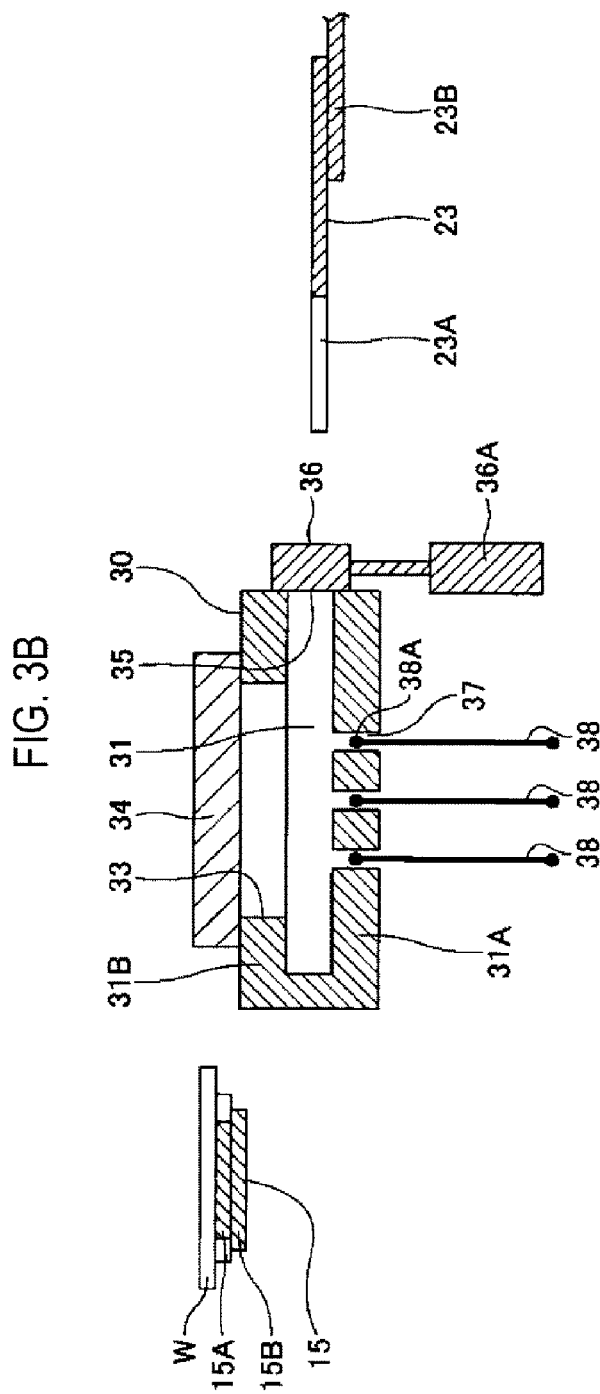

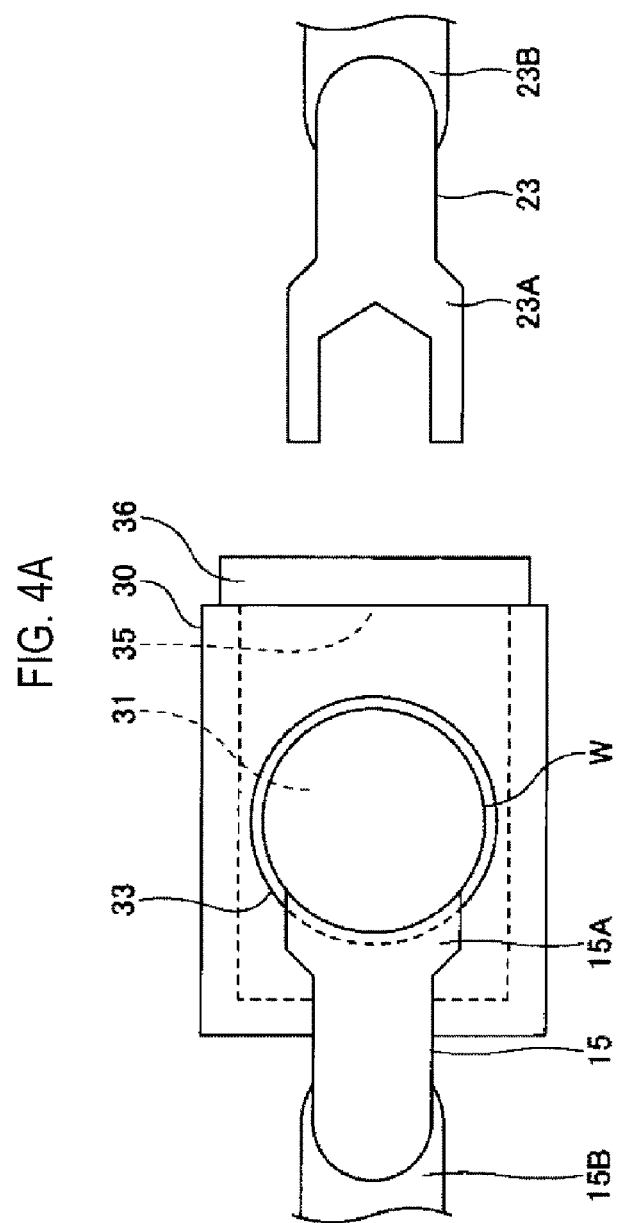

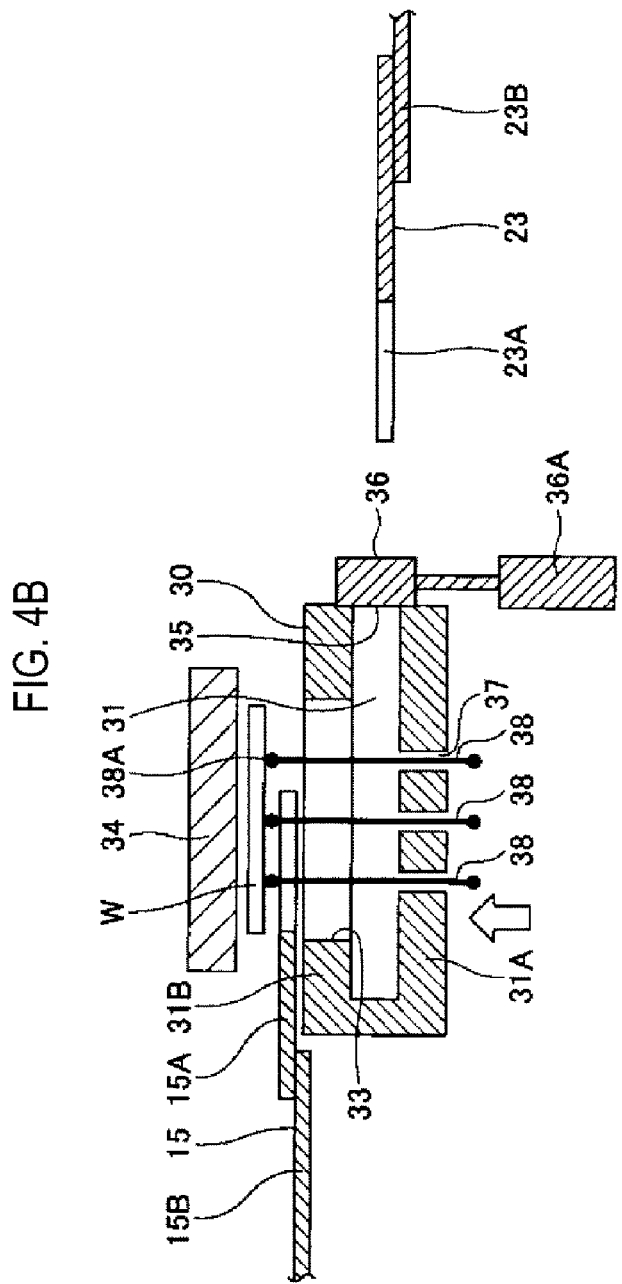

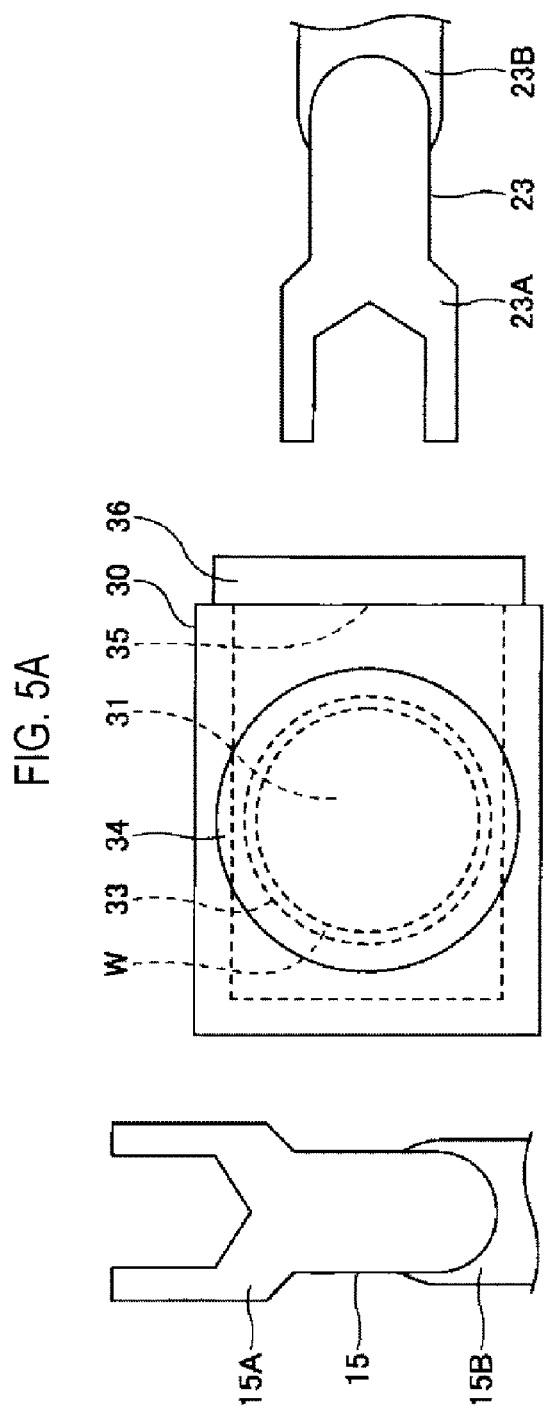

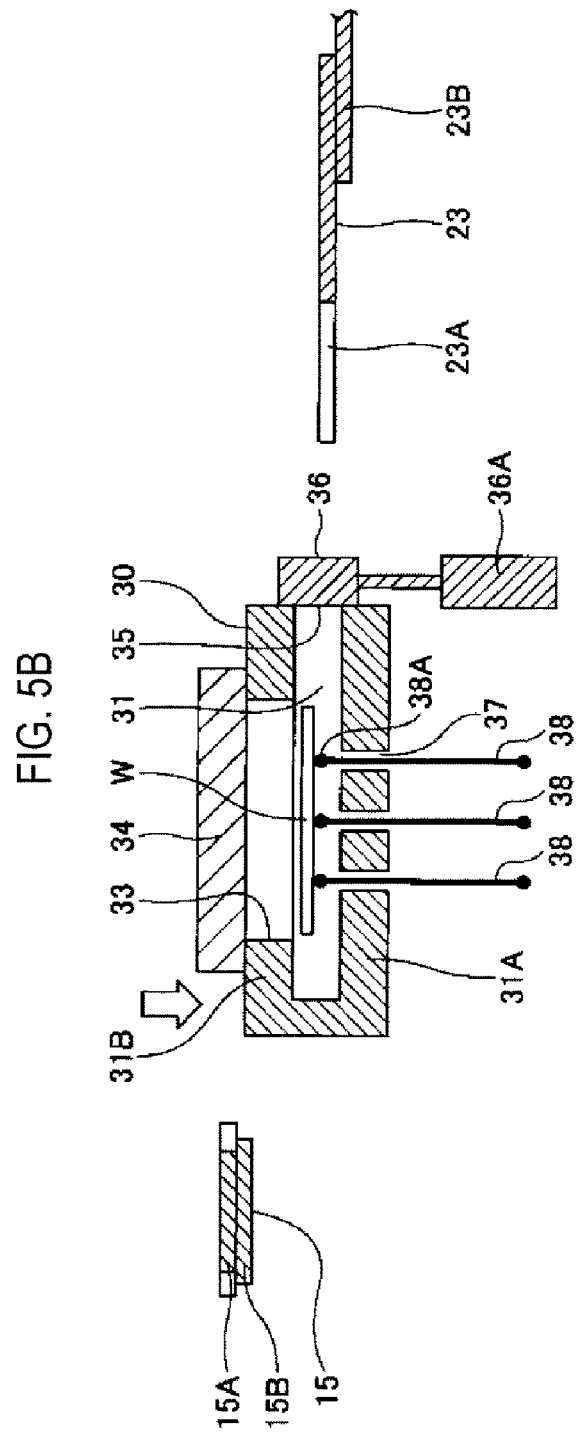

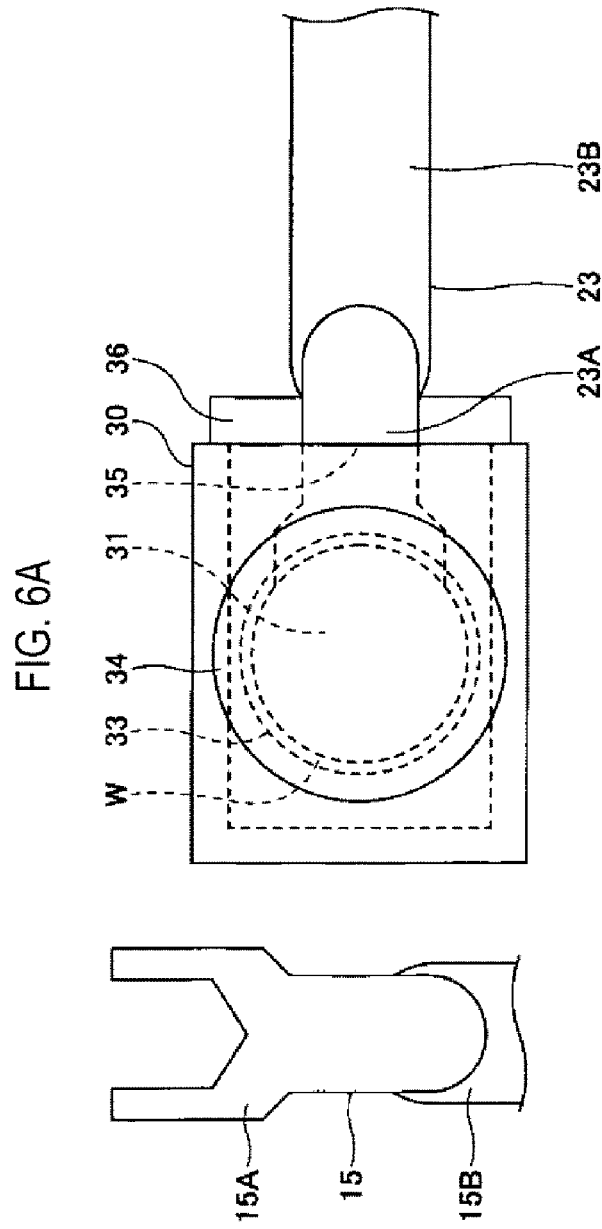

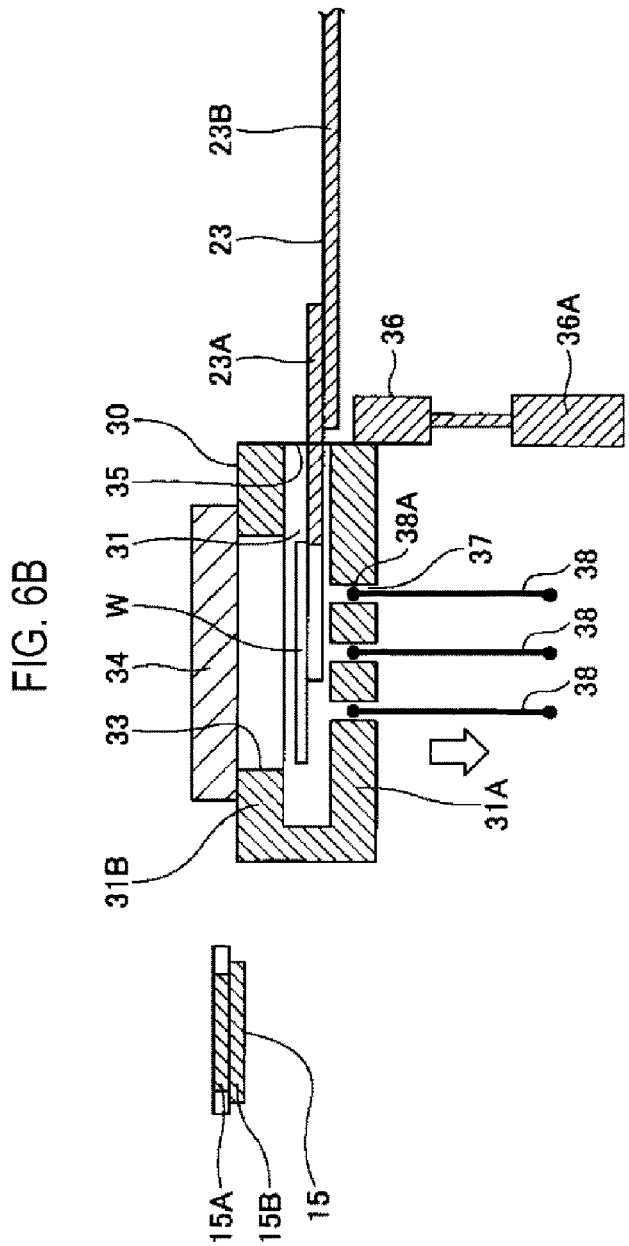

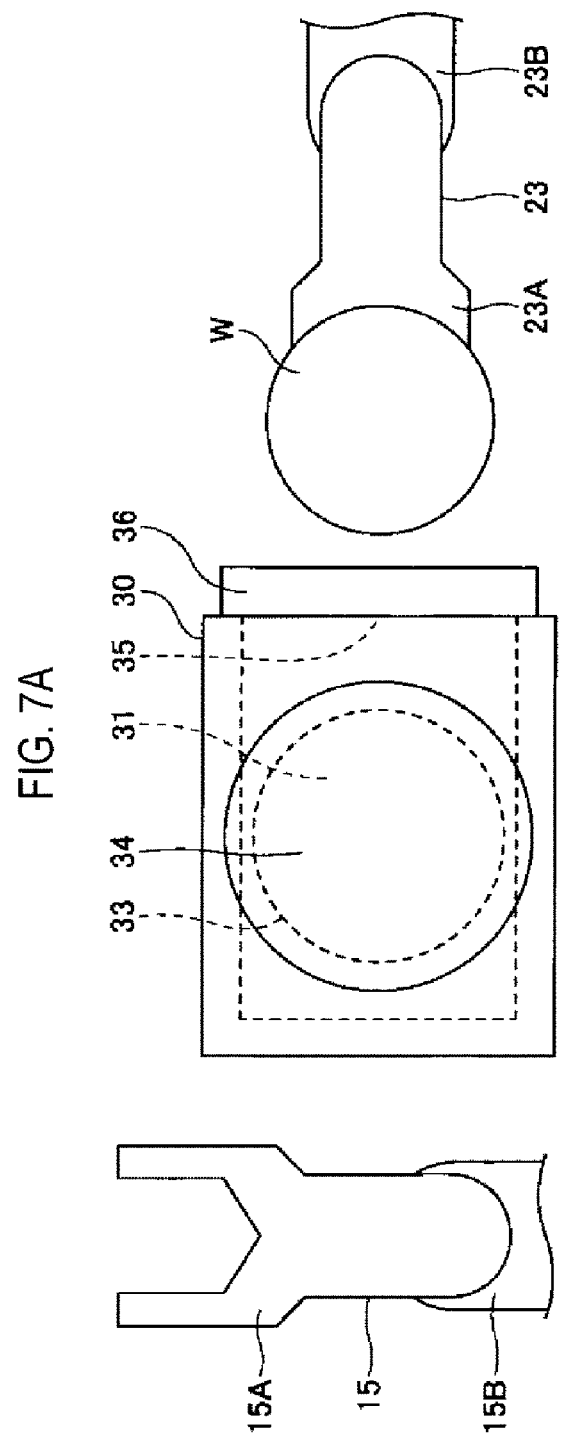

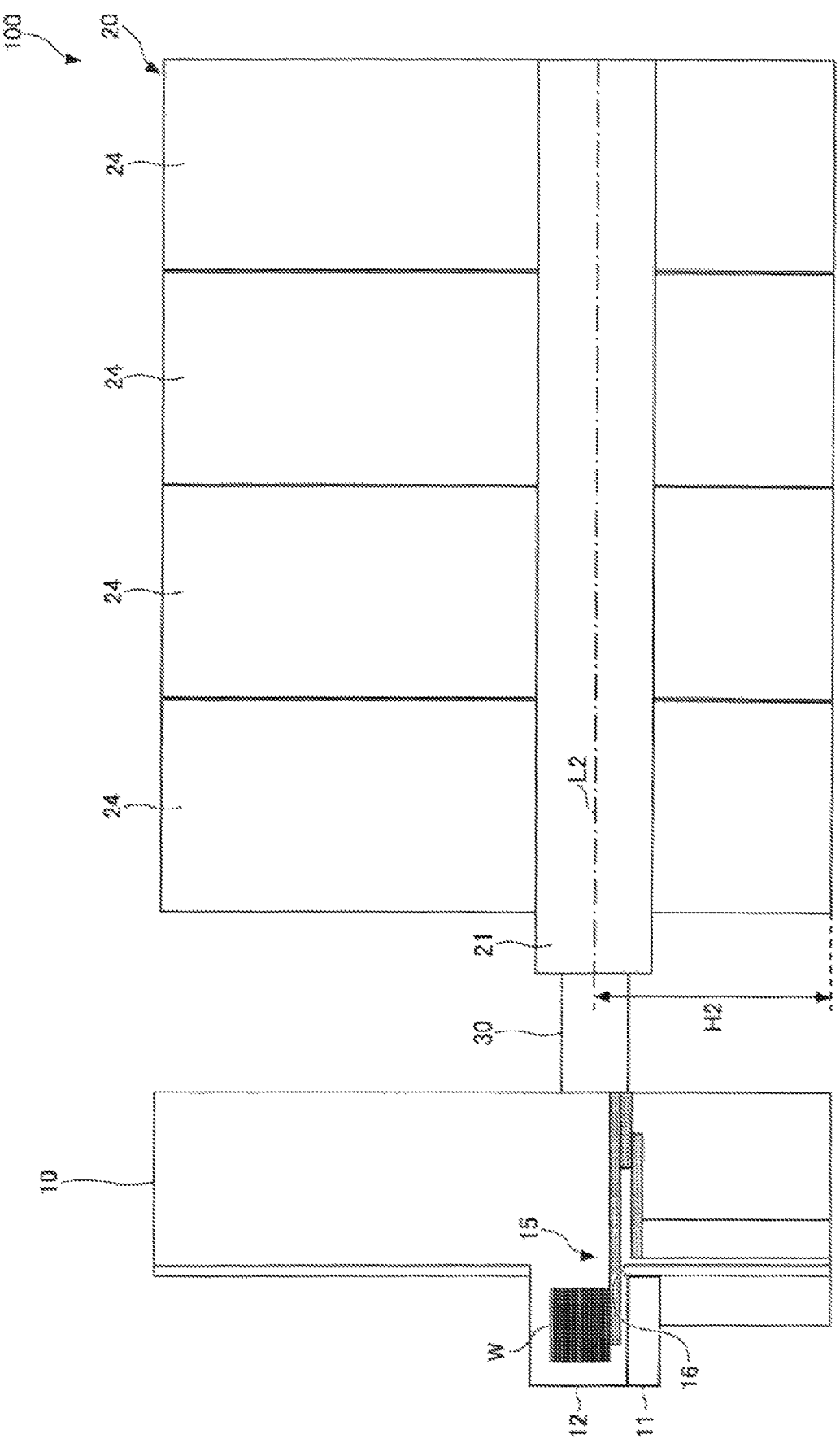

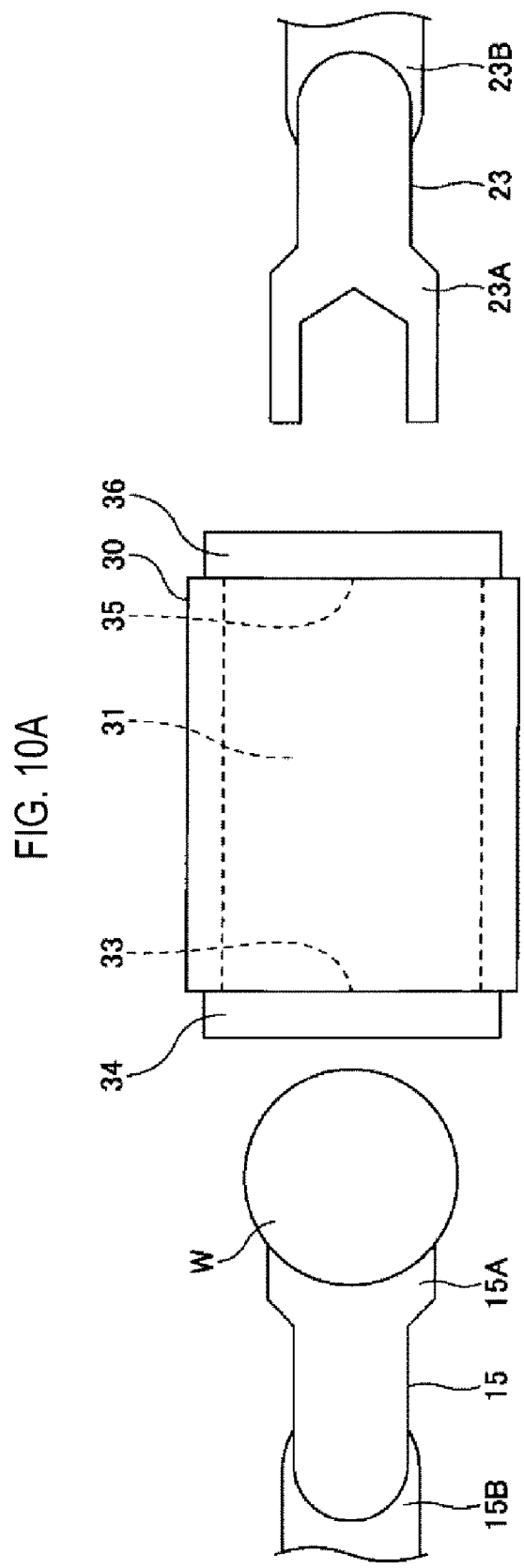

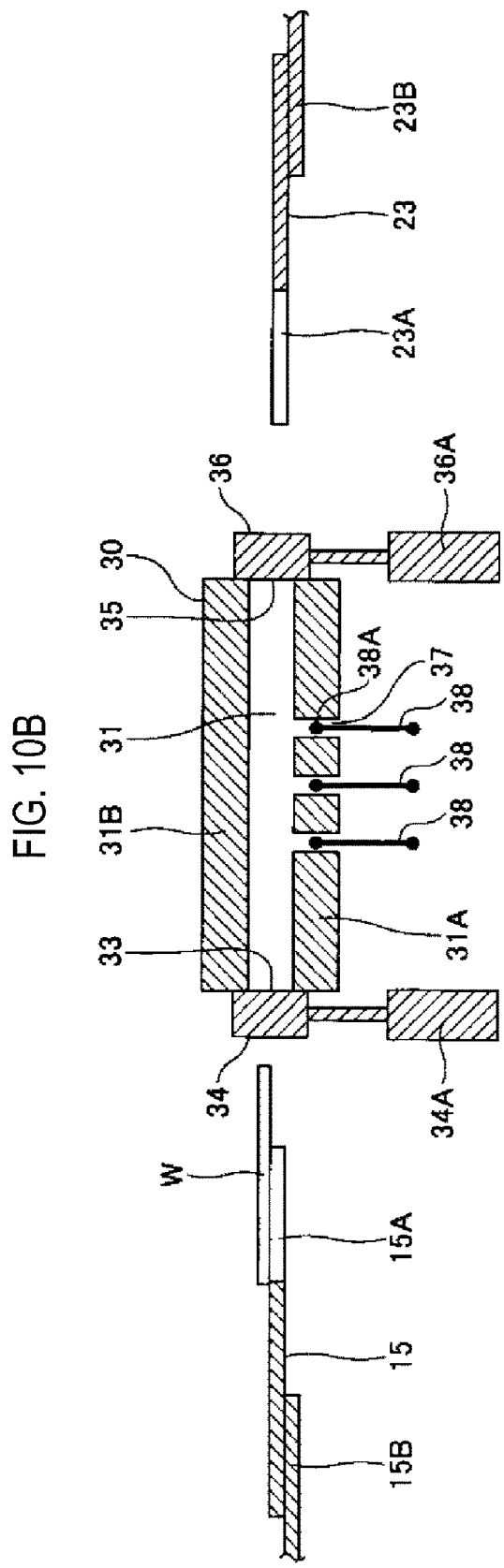

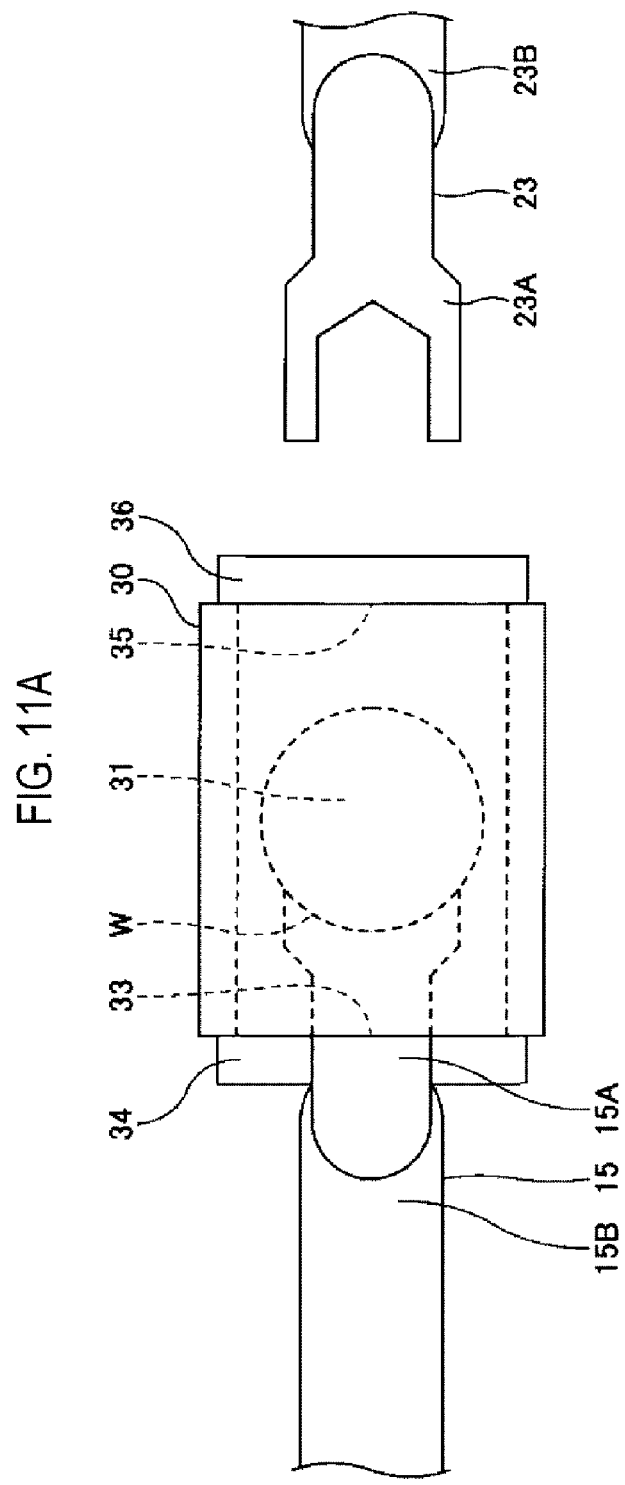

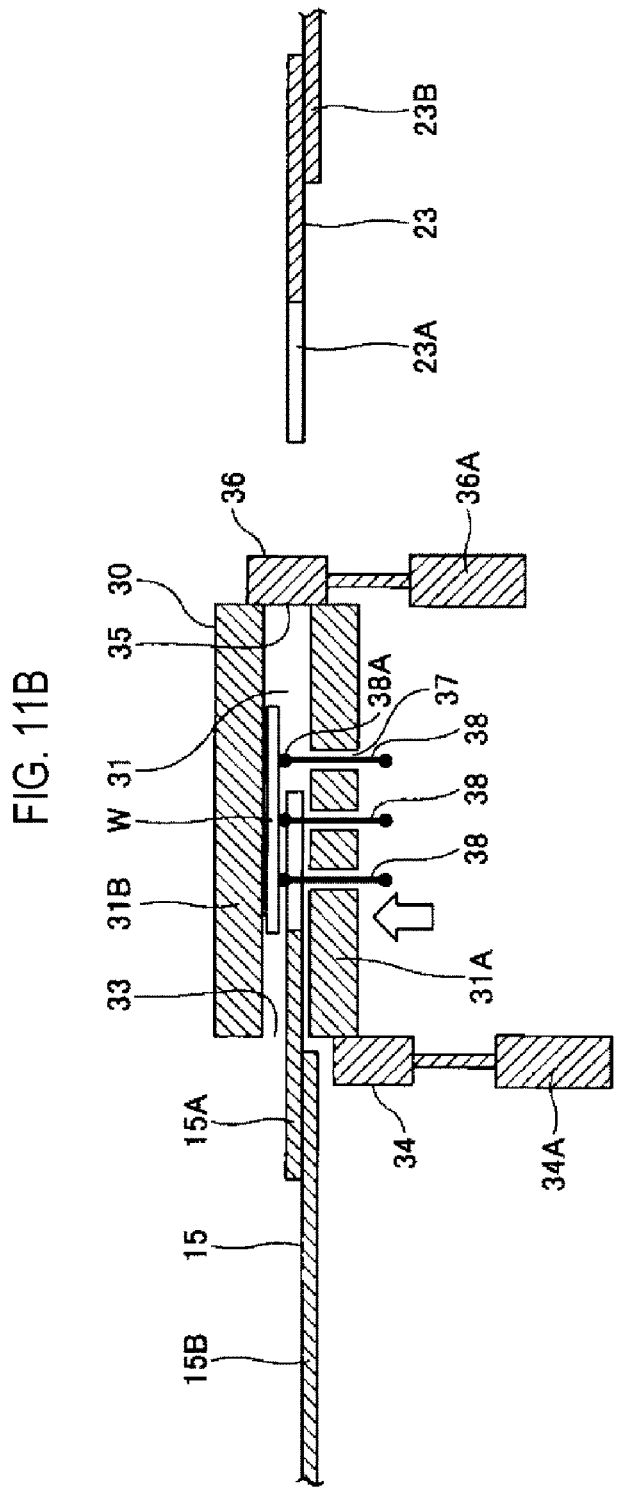

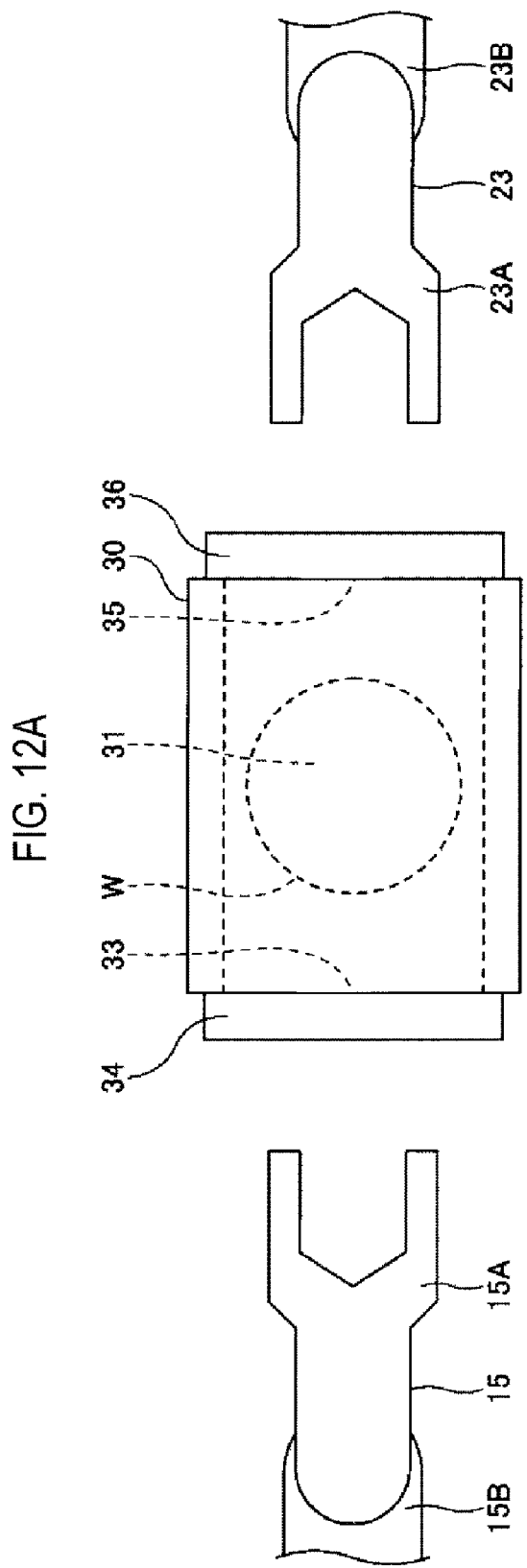

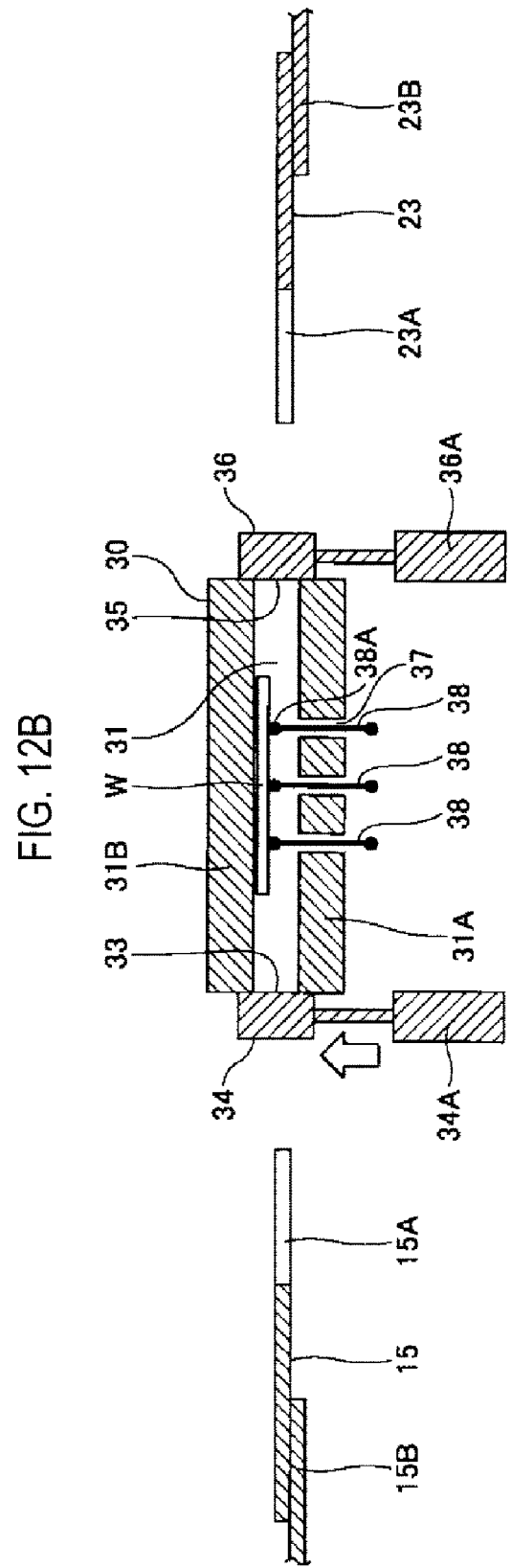

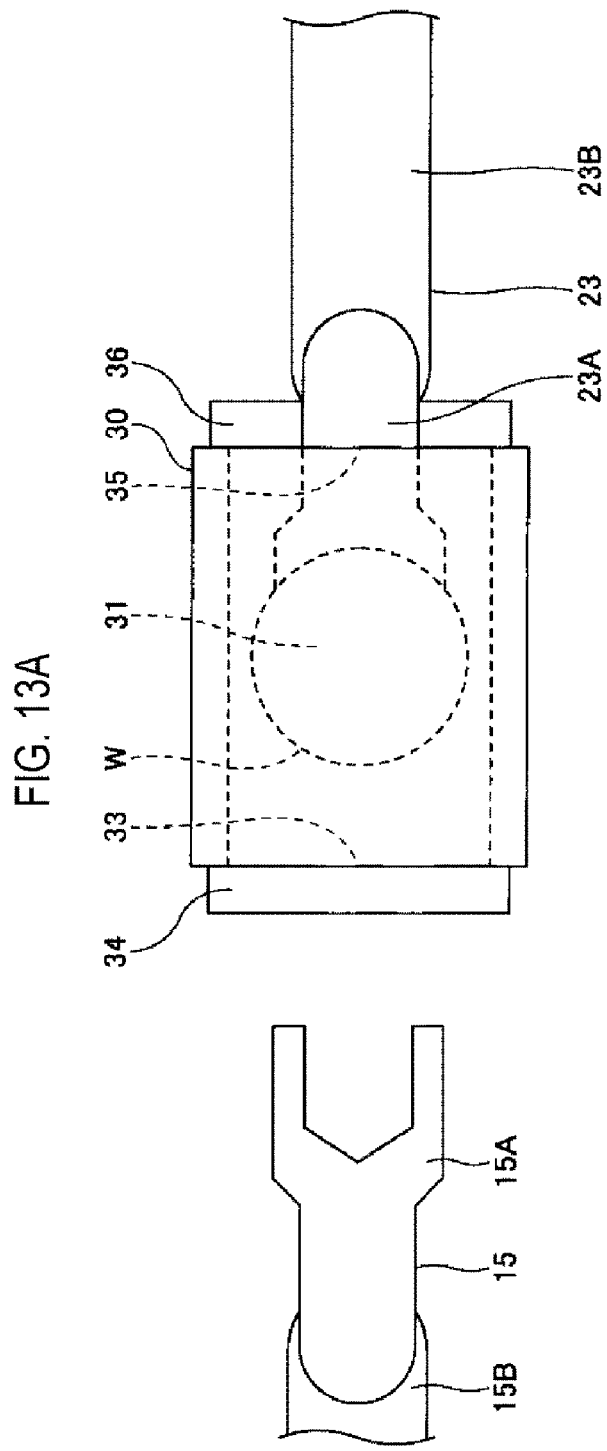

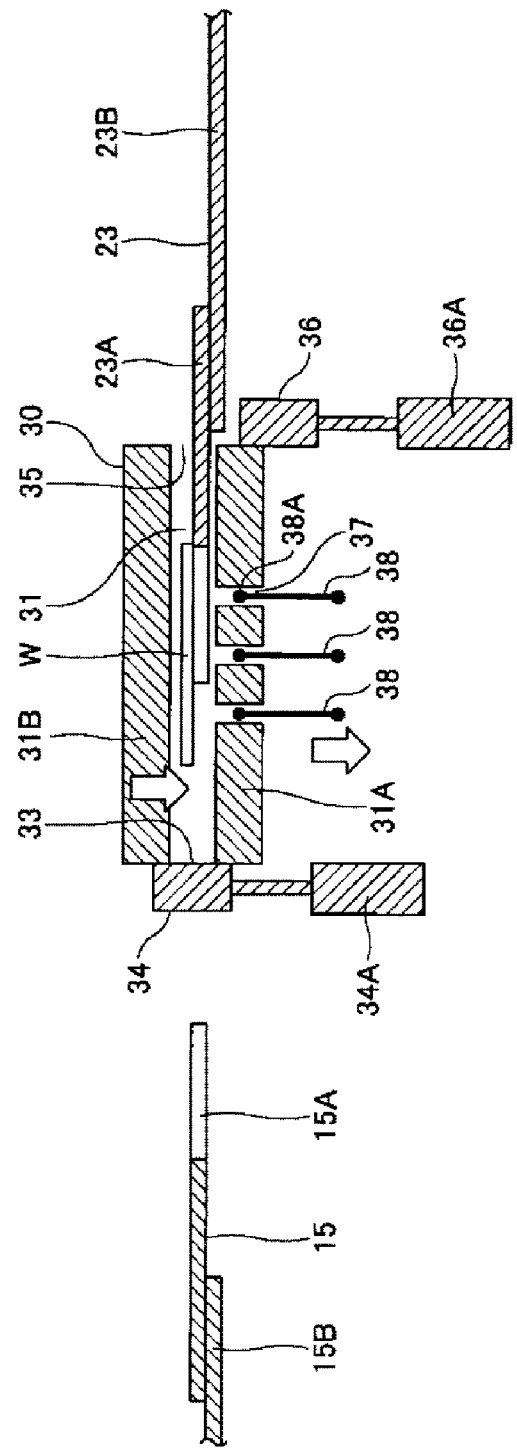

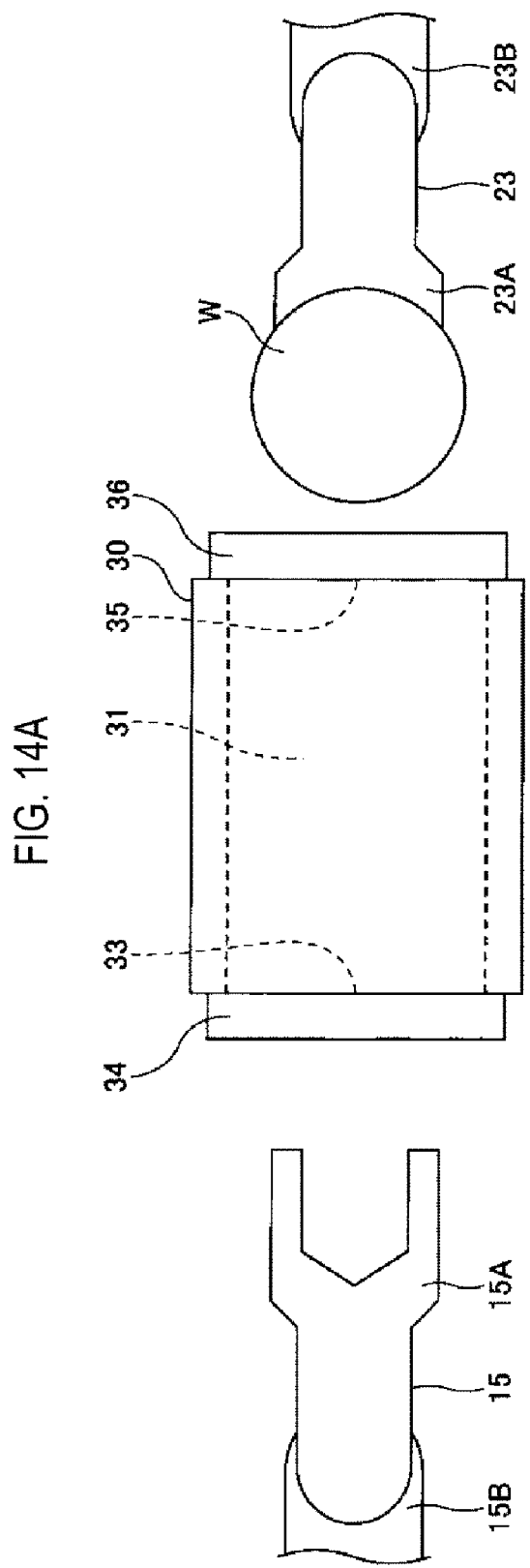

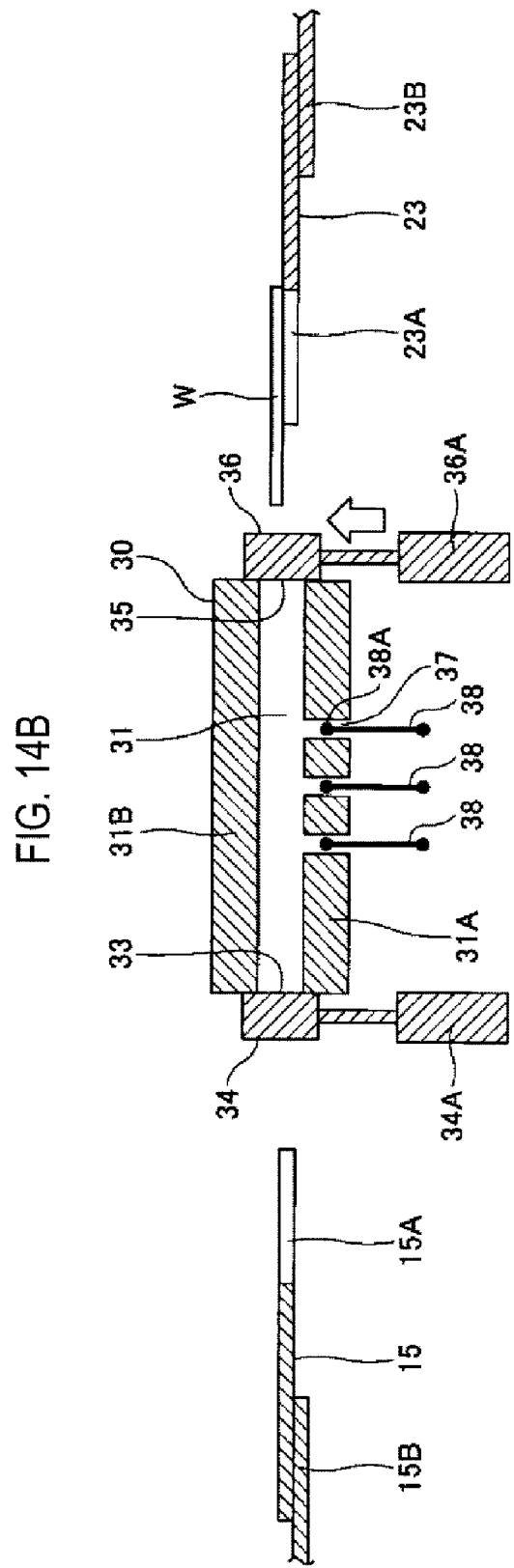

SUBSTRATE PROCESSING APPARATUS

CROSS-REFERENCE TO RELATED APPLICATION

This application is based upon and claims the benefit of priority from Japanese Patent Application No. 2017-070175, filed on Mar. 31, 2017, the entire contents of which are incorporated herein by reference.

TECHNICAL FIELD

The present disclosure relates to a substrate processing apparatus.

BACKGROUND

In a substrate processing apparatus that performs vacuum processing such as film formation or etching on a semiconductor wafer (hereinafter, referred to as a "wafer"), a process module having a plurality of process chambers in which the wafer is processed under a vacuum atmosphere is installed in order to increase the productivity of the wafer. In addition, a transfer module for transferring a substrate under an air atmosphere is connected to the process module, and a load lock module having a plurality of load lock chambers configured to switch between the air atmosphere and the vacuum atmosphere is installed between the process module and the transfer module.

For example, there is a semiconductor processing apparatus according to the related art which includes a process cluster having a plurality of process chambers that operate under a vacuum, an equipment front end module (EFEM) for supplying a wafer to the plurality of process chambers, and two load locks installed between the process cluster and the EFEM.

In the conventional substrate processing apparatus, however, although the processing capability of the substrate is increased, there is a problem that the installation area of the substrate processing apparatus increases due to an increase in size of each module such as the process module or the like (see FIGS. 8 to 14).

SUMMARY

The present disclosure provides some embodiments of a substrate processing apparatus capable of reducing an installation area of a substrate processing apparatus while maintaining the processing capability of a substrate.

According to one embodiment of the present disclosure, there is provided a substrate processing apparatus, including a substrate processing part configured to process a substrate under a vacuum atmosphere, a substrate transfer part connected to the substrate processing part and configured to transfer the substrate under an air atmosphere, and a load lock part disposed between the substrate processing part and the substrate transfer part and configured to switch between the air atmosphere and the vacuum atmosphere, wherein at least a part of the load lock part is disposed inside the substrate transfer part.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a cross sectional view taken along line II-II in FIG. 1.

FIG. 3A is a plan view schematically illustrating a positional relationship between a wafer and a load lock module in the substrate processing apparatus according to the present embodiment, and FIG. 3B is a cross sectional view of FIG. 3A.

FIG. 4A is a plan view schematically illustrating a positional relationship between the wafer and the load lock module in the substrate processing apparatus according to the present embodiment, and FIG. 4B is a cross sectional view of FIG. 4A.

FIG. 5A is a plan view schematically illustrating a positional relationship between the wafer and the load lock module in the substrate processing apparatus according to the present embodiment, and FIG. 5B is a cross sectional view of FIG. 5A.

FIG. 6A is a plan view schematically illustrating a positional relationship between the wafer and the load lock module in the substrate processing apparatus according to the present embodiment, and FIG. 6B is a cross sectional view of FIG. 6A.

FIG. 7A is a plan view schematically illustrating a positional relationship between the wafer and the load lock module in the substrate processing apparatus according to the present embodiment.

FIG. 9 is a cross sectional view taken along line IX-IX in FIG. 8.

FIG. 10A is a plan view schematically illustrating a positional relationship between a wafer and a load lock module in the conventional substrate processing apparatus, and FIG. 10B is a cross sectional view of FIG. 10A.

FIG. 11A is a plan view schematically illustrating a positional relationship between the wafer and the load lock module in the conventional substrate processing apparatus, and FIG. 11B is a cross sectional view of FIG. 11A.

FIG. 12A is a plan view schematically illustrating a positional relationship between the wafer and the load lock module in the conventional substrate processing apparatus, and FIG. 12B is a cross sectional view of FIG. 12A.

FIG. 13A is a plan view schematically illustrating a positional relationship between the wafer and the load lock module in the conventional substrate processing apparatus, and FIG. 13B is a cross sectional view of FIG. 13A.

FIG. 14A is a plan view schematically illustrating a positional relationship between the wafer and the load lock module in the conventional substrate processing apparatus, and FIG. 14B is a cross sectional view of FIG. 14A.

DETAILED DESCRIPTION

Figure 1:
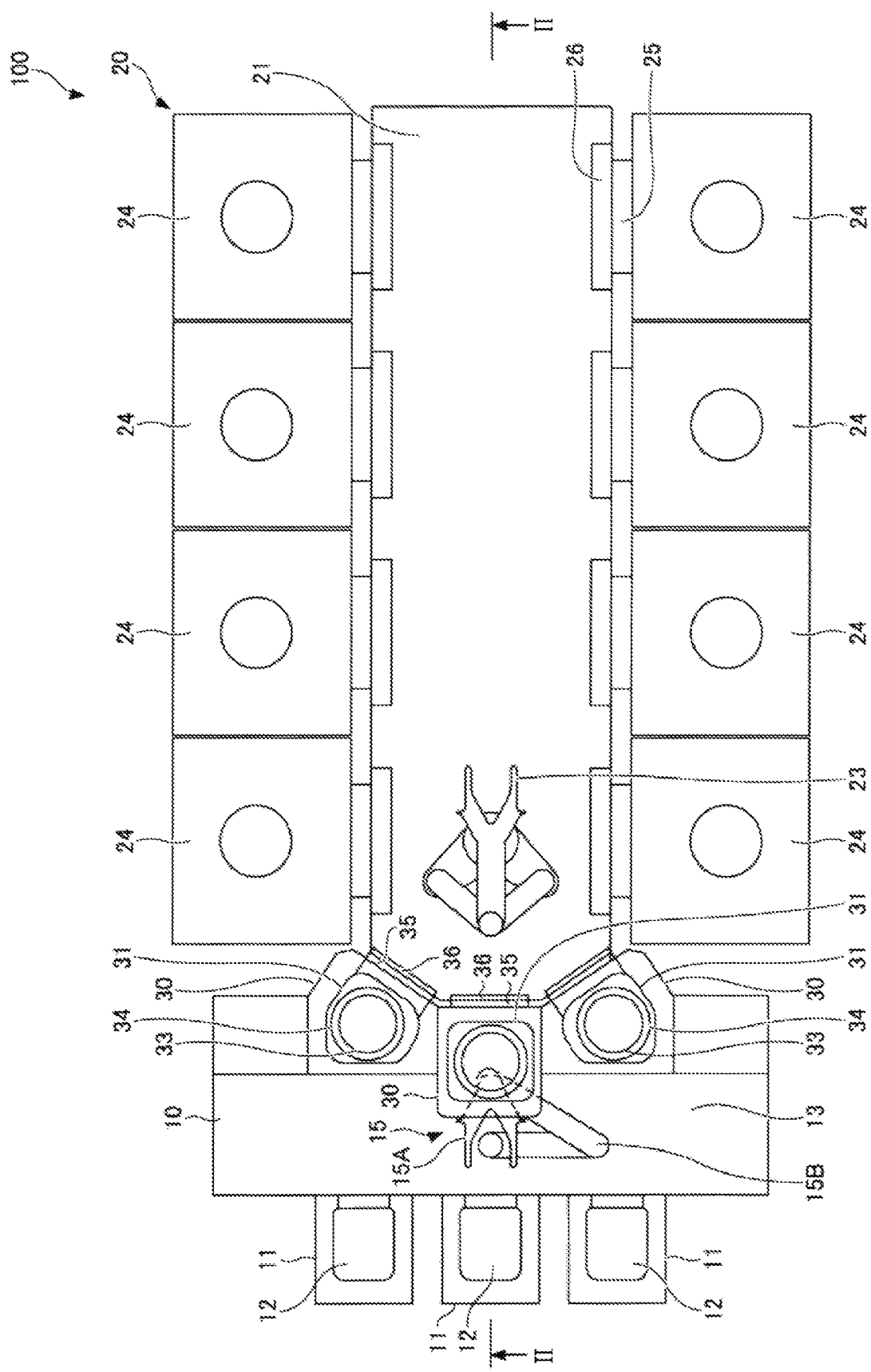
FIG. 1 is a plan view illustrating a substrate processing apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, the configuration of a substrate processing apparatus according to an embodiment of the present disclosure will be described with reference to the drawings. Further, in the present embodiment, common parts in the respective drawings are given like reference numerals or corresponding reference numerals and a description thereof will be omitted.

FIG. 1 is a plan view illustrating a substrate processing apparatus according to an embodiment of the present disclosure, and FIG. 2 is a cross sectional view taken along line II-II in FIG. 1.

As illustrated in FIG. 1, a substrate processing apparatus 100 according to this embodiment includes a transfer module 10, a processing unit 20, and load lock modules 30. The transfer module 10, the processing unit 20, and the load lock module 30 are examples of a substrate transfer part, a substrate processing part, and a load lock part constituting the substrate processing apparatus.

The transfer module 10 constitutes an equipment front end module (EFEM) disposed on a front surface (or an upstream side) of the processing unit 20, and is connected to the processing unit 20. The transfer module 10 includes three load ports 11 on which carriers 12 constituting a transfer vessel that accommodates a plurality of substrates (wafers) W are respectively loaded, and a transfer chamber 13 which communicates with the load ports 11 so as to be opened and closed and to which the wafers W are transferred.

As illustrated in FIG. 2, an inlet/outlet 16 is installed in the transfer chamber 13 so as to be opened through a sidewall surface at the load port 11 side so that the wafers W are loaded and unloaded between the load port 11 and the transfer chamber 13. In addition, an opening/closing door (not shown) for opening and closing the inlet/outlet 16 is installed at the inlet/outlet 16. A fan filter unit (not shown) is installed on an upper surface side of the transfer chamber 13, and the interior of the transfer chamber 13 is a space under a positive pressure clean air atmosphere (atmospheric atmosphere). The internal atmosphere of the transfer chamber 13 of the transfer module 10 may also be a nitrogen atmosphere.

Returning to FIG. 1, a robot 15 is disposed in the transfer chamber 13. The robot 15 has a contractible/extendable and rotatable joint arm 15B, and a hand 15A that holds the wafers W at a leading end of the joint arm 15B. Thus, the robot 15 enters the carriers 12, takes out the wafer W, and transfers the wafer W to and from the processing unit 20. The robot 15 is an example of a first transfer mechanism.

The processing unit 20 has a vacuum transfer chamber 21, an arm mechanism 23, and a process module 24. The vacuum transfer chamber 21 transfers the wafers W received from the transfer module 10 via the load lock modules 30 to a plurality of process modules 24 under a vacuum atmosphere. The arm mechanism 23 is an example of a second transfer mechanism.

The transfer module 10 is connected to the vacuum transfer chamber 21 via the load lock modules 30, at a lateral surface of the transfer module 10 which faces a longitudinal direction of the vacuum transfer chamber 21.

The vacuum transfer chamber 21 is hermetically connected to load lock chambers 31 by an opening/closing door (gate valve) 36. The plurality of process modules 24 are hermetically connected to both side surfaces in the longitudinal direction of the vacuum transfer chamber 21 by gate valves 26. In the process modules 24, vacuum processing such as film formation or the like may be performed on the wafers W. The type of processing performed by the process modules 24 is not limited to film formation, and processing such as etching, ashing, annealing or the like may also be performed.

A loading table on which the wafers W to be processed are loaded, each processing gas supply part (not shown) for supplying a processing gas for film formation into the process modules 24, a plasma generation mechanism (not shown) used when a film is formed using plasma, and the like are installed in the process modules 24.

A moving mechanism (not shown) that is movable in the longitudinal direction is installed in a bottom portion of the vacuum transfer chamber 21. A pillar (not shown), and the arm mechanism 23 configured to be moved up and down along the pillar are installed in the moving mechanism.

The arm mechanism 23 has a hand 23A on which the wafer W is seated during transfer of the wafer and an arm 23B (see FIGS. 1 and 3). The configuration of the arm mechanism 23 is not limited. For example, one or more joint arms which are contractible/extendable and rotatable may be moved along a traveling rail, and may be installed so as to be moved up and down along the pillar.

As illustrated in FIGS. 1 and 2, the load lock module 30 is disposed between the transfer module 10 and the vacuum transfer chamber 21 of the processing unit 20, and switches the interior of the load lock chamber 31 between the air atmosphere and the vacuum atmosphere. Thus, the wafers W are transferred from the transfer module 10 at the atmosphere side to the vacuum transfer chamber 21, or from the vacuum transfer chamber 21 to the transfer module 10 at the atmosphere side. As illustrated in FIG. 1, the three load lock modules 30 are arranged on the upstream side of the vacuum transfer chamber 21. The number of load lock modules 30 is not limited, and may be one or more.

The three load lock modules 30 are arranged side by side in the horizontal direction. In this example, the three load lock modules 30 are arranged radially with respect to the processing unit 20, but the arrangement of the load lock modules 30 is not particularly limited. Each of the load lock modules 30 has the load lock chamber 31, and each load lock chamber 31 communicates with the vacuum transfer chamber 21 via gates 35 so as to be opened and closed by opening and closing the opening/closing door 36. The wafers W are transferred between the load lock chambers 31 and the vacuum transfer chamber 21 by the arm mechanism 23 of the vacuum transfer chamber 21.

An operation of the substrate processing apparatus will be described. In the substrate processing apparatus 100, when the carriers 12 that accommodate the wafers W are loaded on the load ports 11 of the transfer module 10, the wafer W is taken out from the carriers 12 by the hand 15A of the robot 15 of the transfer module 10 and is transferred to the arm mechanism 23 of the vacuum transfer chamber 21 via the load lock modules 30. When the wafer W is transferred to the arm mechanism 23 of the vacuum transfer chamber 21, the arm mechanism 23 is moved to a process module 24 in which film formation is performed on the wafer W. Then, the arm mechanism 23 is turned to face the process modules 24.

On the other hand, the gate valve 26 of the process module 24 is opened, so that the gate 25 is opened in the process module 24. The joint arm of the arm mechanism 23 enters the process chambers, and the wafer W is moved onto the loading table. A lifter (not shown) on the loading table of the process chambers is raised and the wafer W is received from a fork of the joint arm. Then, the joint arm is retracted and the gate valve 26 is closed, and the lifter is lowered and the wafer W is loaded on the loading table.

Subsequently, film formation of the wafer W is performed in the process modules 24. Prior to the transfer operation of the wafer W, the operation of transferring the wafer W, which have been completed in the film formation in the process modules 24, to and from the arm mechanism 23 in the vacuum transfer chamber 21 may also be performed.

The arm mechanism 23 in the vacuum transfer chamber 21, which has transferred the wafers W to and from a predetermined process module 24, sequentially moves to the arrangement position for the process module 24 which performs film formation on other wafers W to transfer the wafers W. By this operation, it is possible to concurrently perform film formation on the wafers W in the plurality of process modules 24 installed in the substrate processing apparatus.

When the film formation is completed in the process modules 24, the arm mechanism 23 in the vacuum transfer chamber 21 is moved. The arm mechanism 23 receives the wafer W after the film formation from the process modules 24. Then, the arm mechanism 23 in the vacuum transfer chamber 21 transfers the wafer W to the transfer module 10 via the load lock modules 30, and the wafer W after the film formation is returned to the original carriers 12 through a reverse path of the loading path. Thus, the series of processing of the wafers W is completed.

In this embodiment, at least a part of the load lock modules 30 is disposed in the transfer module 10. The phrase at least a part of the load lock modules 30 means that all of the load lock modules 30 are allowed to be disposed in the transfer module 10. Specifically, as illustrated in FIGS. 1 and 2, a part of the three load lock chambers 31 disposed in the horizontal direction is arranged in the transfer module 10. That is, all (three) of the load lock chambers 31 are partially disposed in the transfer module 10.

Specifically, the load lock modules 30 are configured to penetrate the sidewall of the transfer module 10 positioned at the vacuum transfer chamber 21 side so as to communicate with the vacuum transfer chamber 21 at substantially the same height as the vacuum transfer chamber 21, and to be arranged in the interior of the transfer module 10. As shown in FIG. 2 illustrating a cross section taken along line II-II in FIG. 1, the entire central load lock module 30 is contained in the transfer module 10. An opening/closing door 34 for opening and closing the gate 33 is installed in the gate 33. The shape of the opening/closing door 34 is not particularly limited so long as it has a dimension that can cover the gate 33. In this example, the shape of the opening/closing door 34 is circular according to the opening shape of the gate 33. The gate 33 has a diameter slightly larger than the diameter (e.g., 300 mm) of the wafers W so that the wafers W can be transferred from the upper portion of the load lock module 30 into the load lock chamber 31. That is, in this embodiment, the central load lock module 30 protrudes into the interior by 300 mm or more from the sidewall of the transfer module 10.

Furthermore, in this embodiment, the left and right load lock modules 30 illustrated in FIG. 1 are arranged obliquely with respect to the transfer module 10 so that at least a part of the right and left load lock modules 30 is arranged within the transfer module 10.

In this manner, the footprint of the substrate processing apparatus 100 can be reduced by utilizing a configuration in which a part or all of the load lock modules 30 is disposed in the interior of the transfer module 10. In addition, by containing the load lock modules 30 in the transfer module 10, the wafer W can be transferred within the interior of the transfer module 10, can pass through the gate 33 existing within the transfer module 10, and can be loaded into the load lock module 30.

However, a configuration in which the vicinity of the sidewall of the transfer module 10 through which the load lock modules 30 protrude protrudes toward the vacuum transfer chamber 21 can be possible. In this configuration, the opening/closing door 34 can be vertically opened and closed in a space formed in the protrusion portion of the transfer module 10. By forming the protrusion portion in the sidewall of the transfer module 10 in this way, it is possible to set the size of the portion of the load lock modules 30 that is disposed in the transfer module 10 to be less than the diameter of the wafers W (e.g., less than 300 mm).

By doing like this, at least one of the three load lock modules 30 loads and unloads the wafers W from above the load lock module 30. Also, the other load lock modules 30 may load and unload the wafers W from the lateral portion of the load lock module 30.

With this configuration, in this embodiment, a part or all of the load lock modules 30 can be disposed in the interior of the transfer module 10. Thus, the size of the substrate processing apparatus 100 is reduced by the size of the portion of the load lock module 30 that is disposed in the transfer module 10. That is, it is possible to reduce the installation size of the substrate processing apparatus 100 while maintaining the number of process modules 24 and the number of load lock modules 30. Therefore, according to this embodiment, it is possible to reduce the installation area of the substrate processing apparatus while maintaining the processing capability (productivity) for the wafers.

On the other hand, by disposing the load lock modules on an outside ceiling surface of the transfer module 10, it is also possible to reduce the footprint of the apparatus.

However, in this case, since the load lock modules are on the ceiling surface of the transfer module 10, the transfer path in which the wafer W unloaded from the carriers 12 is transferred from the gate 33 of the load lock modules into the load lock chambers 31 is lengthened and thus it takes a longer time to transfer, compared with this embodiment. Thus, when the load lock modules are disposed on the ceiling surface of the transfer module 10, there may be a case in which the throughput is reduced due to the longer transfer time, compared with this embodiment.

From the above, if it is configured such that a part or all of the load lock modules 30 is disposed in the interior of the transfer module 10 as in this embodiment, the transfer path in which the wafer W unloaded from the carriers 12 is transferred from the gate 33 of the load lock module into the load lock chambers 31 is shortened. Thus, it is possible to suppress the throughput from being decreased while reducing the footprint.

The height of the upper limit of the transfer range R1 in the height direction in which the wafers W are transferred to and from the inlet/outlet 16 is below the bottom portion of the load lock module 30. Specifically, as illustrated in FIG. 2, the height of the upper limit of the transfer range R1 in the height direction in which the wafers W are transferred to and from the inlet/outlet 16 of the transfer module 10 is set to be lower than the height of the lower limit of the transfer range R2 in the height direction in which the wafers W are transferred to and from the load lock modules 30.

Furthermore, as illustrated in FIG. 2, the transfer range R1 corresponds to an opening in the height direction of the inlet/outlet 16. The transfer range R2 corresponds to a range in which the opening/closing door 34 of the gates 33 of the load lock chambers 31 moves up and down. In this case, R1>R2 is established.

In this embodiment, the height H1 of the transfer line L1 of the wafer W between the processing unit 20 and the load lock modules 30 illustrated in FIG. 2 is set higher than the height H2 of the transfer line L2 between the processing unit 20 and the load lock modules 30 in the conventional substrate processing apparatus 100 illustrated in FIG. 9, establishing H1>H2.

As described above, in this embodiment, since the transfer line L1 in the vacuum transfer chamber 21 is provided at a position higher than the conventional transfer line L2, it is possible to secure a space for entering the lower portion of the vacuum transfer chamber 21. Therefore, it becomes easy to perform maintenance from the lower portion of the vacuum transfer chamber 21 and maintenance of the process chamber peripheral devices under the process chambers from the lower portion of the vacuum transfer chamber 21.

Next, a structure of the load lock module will be described. FIGS. 3A to 7B are views schematically illustrating a positional relationship between a wafer and the load lock module 30 in the substrate processing apparatus according to this embodiment. FIGS. 3A to 7A are plan views schematically illustrating a positional relationship between the wafer and the load lock module in the substrate processing apparatus according to this embodiment, and FIGS. 3B to 7B are cross sectional views of FIGS. 3A to 7A.

As illustrated in FIGS. 3A and 3B, the load lock chamber 31 of the load lock module 30 forms a space in which the wafer W is loaded therein, and has the gate 33 (first opening) that communicates with the transfer module 10 so as to be opened and closed, and a second opening (gate 35) that communicates with the vacuum transfer chamber 21 so as to be opened and closed.

The gate 33 is formed in an upper wall portion 31B of the load lock chamber 31 and is opened in an upper direction of the load lock chamber 31. The opening width of the gate 33 has a dimension larger than the width dimension in the radial direction of the wafer W in the horizontal direction. The shape of the gate 33 is not particularly limited, but in this example, it is circular according to the shape of the wafer W.

The opening/closing door 34 for opening and closing the gate 33 is disposed so as to be vertically moved, and can open and close the gate 33. Furthermore, the method for driving the opening/closing door 34 is not particularly limited.

The gate 35 is opened in a lateral direction of the load lock chamber 31, and the gate 35 has the width of the opening in the horizontal direction which is larger than the width dimension of the wafer W in the radial direction and a height dimension in which the arm mechanism 23 (hand 23A) as described herein below can enter the gate 35, holding the wafer W.

The opening/closing door 36 for opening and closing the gate 35 is installed in the gate 35. The method of driving the opening/closing door 36 is not particularly limited, but it can be opened and closed by driving a driving mechanism 36A. The shape of the opening/closing door 36 is not particularly limited so long as it has a dimension that covers the gate 35. In this example, the shape of the opening/closing door 36 is rectangular according to the opening shape of the gate 35.

Furthermore, a through hole 37 is formed in the bottom wall portion 31A of the load lock chamber 31, and an elevating mechanism (lifter pins 38) which can be inserted through the through hole 37 is disposed therein. The lifter pins 38 can vertically move up and down in the load lock chamber 31 and support the wafer W above the gate 33. In addition, a seal member (not shown) that vertically movable around the lifter pin 38 is installed between the through hole 37 and the lifter pin 38 so that the interior of the load lock chamber 31 is kept sealed.

In addition, a control part (not shown) is installed in the substrate processing apparatus of this example. The control part may be configured as a computer including, for example, a central processing unit (CPU) and a memory part. In this control part, a program having a group of steps (instructions) for controlling the operation of each of the transfer module 10, the processing unit 20, and the load lock modules 30 is recorded in the memory part. This program is stored in a storage medium such as, for example, a hard disk, a compact disc, a magneto-optical disc, a memory card, or the like, and may be installed on the computer therefrom.

An operation of the load lock module will be described with reference to FIGS. 3A to 7B. First, FIGS. 3A and 3B illustrates a state before the wafer W is transferred to the load lock module 30. In FIGS. 3A and 3B, the gate 33 and the gate 35 of the load lock module 30 are closed by the opening/closing door 34 and the opening/closing door 36. At this time, the lifter pins 38 are arranged in a state in which the leading end 38A is lowered into the bottom wall portion 31A.

Next, FIGS. 4A and 4B illustrate states when the wafer W is transferred from the transfer module 10 to the load lock module 30. As illustrated in FIG. 2, the robot 15 receives one of a plurality of wafers W accommodated in the carrier 12 and loads it into the transfer module 10. In this state, the robot 15 holds the wafer W on the hand 15A and performs the rotation in the horizontal direction, performs a raising operation using the hand 15A and the joint arm 15B, and transfers the wafer W to the vicinity of the upper portion of the load lock chamber 31, as illustrated in FIGS. 3A and 3B.

Prior to the transfer of the wafer W, the interior of the load lock chamber 31 turns into an air atmosphere, and then the opening/closing door 34 is raised, so that the load lock chamber 31 becomes an opened state as illustrated in FIG. 4B while the gate 33 of the load lock chamber 31 is kept open, from a closed state as illustrated in FIG. 3B.

The joint arm 15B of the robot 15 located near the upper portion of the load lock chamber 31 rotates in the horizontal direction, and as illustrated in FIGS. 4A and 4B, when the wafer W held by the hand 15A is transferred to the upper portion of the gate 33 of the load lock chamber 31 between the opening/closing door 34 and the gate 33, the lifter pins 38 are raised and the leading end 38A of the lifter pins 38 support the wafers W. As illustrated in FIG. 4B, after the lifter pins 38 are raised until the wafer W is separated from the hand 15A, the robot 15 horizontally rotates the hand 15A to take it out from between the opening/closing door 34 and the gate 33, and horizontally rotates and lowers the same to return it to the original position of the transfer module 10.

FIGS. 5A and 5B illustrate states in which after the wafer W is transferred from the gate 33 into the load lock chamber 31, the opening/closing door 34 is lowered, the gate 33 is closed, and the interior of the load lock chamber 31 is closed.

The wafer W carried into the load lock chamber 31 is lowered to the position where it is unloaded through the gate 35 by further lowering the lifter pins 38. An air supply/exhaust pipe (not shown) is installed in the load lock chamber 31 so that the interior of the load lock chamber 31 can be switched from an air atmosphere to a vacuum atmosphere.

FIGS. 6A and 6B illustrate states when the wafer W is transferred from the load lock module 30 to the vacuum transfer chamber 21. In FIGS. 5A and 5B, after the interior of the load lock chamber 31 is switched from an air atmosphere to a vacuum atmosphere, the opening/closing door 36 is lowered and the gate 35 of the load lock chamber 31 is opened. Then, the hand 23A of the arm mechanism 23 of the vacuum transfer chamber 21 moves straight in the horizontal direction and is inserted into the load lock chamber 31.

When the hand 23A of the arm mechanism 23 moves to the lower surface of the wafer W, the lifter pins 38 are lowered (the leading end 38A returns into the through hole 37 of the bottom wall portion 31A), and the wafer W is loaded on the hand 23A.

Figure 7B:
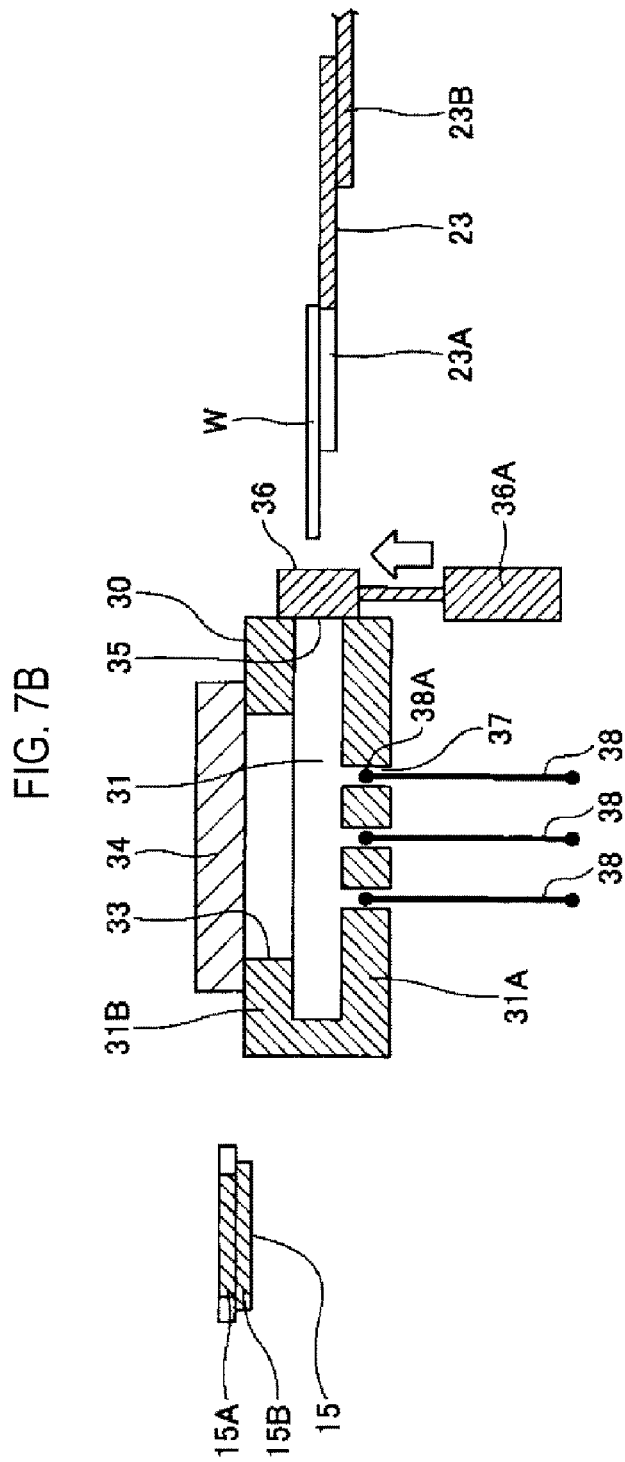
FIG. 7B is a cross sectional view of FIG. 7A.
Figure 8:
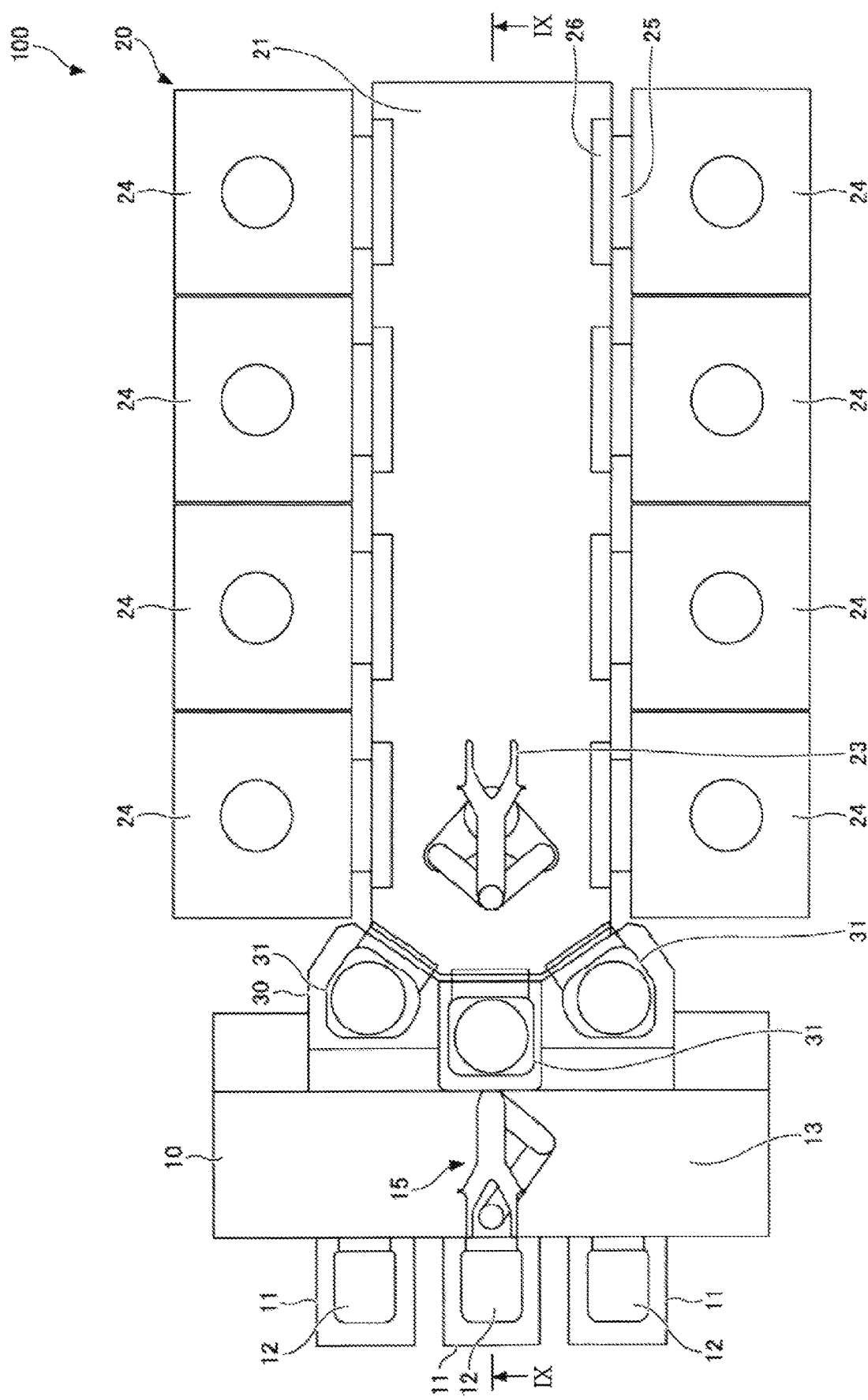
FIG. 8 is a plan view illustrating a conventional substrate processing apparatus.

FIGS. 7A and 7B illustrate states after the wafer W is unloaded from the load lock module 30. In FIGS. 7A and 7B, the wafer W loaded on the hand 23A is unloaded from the gate 35 and is transferred to the vacuum transfer chamber 21. The opening/closing door 36 is raised to the original position, and the gate 35 of the load lock chamber 31 is closed. In this manner, the transfer of the wafer W from the transfer module 10 to the vacuum transfer chamber 21 is completed.

As described above, in this embodiment, at least a part of the load lock modules 30 is arranged in the transfer module 10. This arrangement is possible by a configuration in which the wafer W is loaded into the load lock chamber 31 from the gate 33 that is opened in the upper portion of the load lock module 30 and is unloaded through the gate 35 that is opened in the side portion of the load lock module 30. Thus, according to this embodiment, it is possible to reduce the installation area of the substrate processing apparatus 100 while maintaining the processing capability of the wafer W.

Furthermore, according to this embodiment, since the shape of the gate 33 is circular according to the shape of the wafer W, it is possible to easily position the wafer W when it is transferred to the load lock module 30.

In addition, according to this embodiment, since the position of the wafer W can be easily controlled by the lifter pins 38, it is possible to easily control the transfer of the wafer W from the vertical direction to the horizontal direction of the load lock module 30 or control the transfer of the wafer W from the horizontal direction to the vertical direction.

According to the present disclosure in some embodiments, it is possible to provide a substrate processing apparatus capable of reducing the installation area of the substrate processing apparatus while maintaining the processing capability of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a substrate processing part configured to process a substrate under a vacuum atmosphere;
a substrate transfer chamber connected to the substrate processing part, including an inlet/outlet port which is formed in a sidewall of the substrate transfer chamber and connected to a load port, and configured to transfer the substrate under an air atmosphere, the substrate being loaded into and unloaded from the substrate processing apparatus via the load port; and
a load lock part disposed between the substrate processing part and the substrate transfer chamber and configured to switch between the air atmosphere and the vacuum atmosphere, and including a plurality of load lock chambers arranged horizontally,
wherein at least a part of each of the load lock chambers is disposed in an interior of a space inside the substrate transfer chamber,
wherein the at least a part of each of the load lock chambers includes: a first opening which is formed in an upper surface of each of the load lock chambers, communicates with the substrate transfer chamber and is capable of being opened and closed; and a second opening which is formed in a sidewall of each of the load lock chambers, communicates with the substrate processing part, and is capable of being opened and closed,
wherein the upper surface of each of the load lock chambers protrudes toward the interior of the substrate transfer chamber such that an entire of the first opening is opened in the interior of space inside the substrate transfer chamber in an upper direction of each of the load lock chambers, and
wherein a first height in which the substrate is transferred between the substrate processing part and the load lock part via the second opening is different from a second height in which the substrate is transferred between the substrate transfer chamber and the load port via the inlet/outlet port.

2. The apparatus of claim 1, wherein the first opening is circular in shape having a diameter larger than 300 mm.

3. The apparatus of claim 1, wherein the second opening is opened in a lateral direction of each of the load lock chambers.

4. The apparatus of claim 1, wherein the load lock part includes an elevating mechanism which vertically moves in the interior of each of the load lock chambers to support the substrate above the first opening.

5. The apparatus of claim 4, further comprising:
a first transfer mechanism configured to transfer the substrate between a carrier and the load lock part in the substrate transfer chamber; and
a second transfer mechanism configured to transfer the substrate between the load lock part and the substrate processing part,
wherein the elevating mechanism is configured to transfer the substrate between the first transfer mechanism and the second transfer mechanism in the load lock part.

* * * * *